United States Patent
Toda

Patent Number: 5,359,250
Date of Patent: Oct. 25, 1994

[54] BULK WAVE TRANSPONDER

[75] Inventor: Minoru Toda, Lawrenceville, N.J.

[73] Assignee: The Whitaker Corporation, Wilmington, Del.

[21] Appl. No.: 845,685

[22] Filed: Mar. 4, 1992

[51] Int. Cl.$^5$ .................. H01L 41/02; G01S 13/80
[52] U.S. Cl. .................. 310/313 R; 310/313 D; 342/44; 333/142
[58] Field of Search .......... 310/313 R, 313 A, 313 D; 342/378, 44, 51; 333/141, 142, 145, 149

[56] References Cited

U.S. PATENT DOCUMENTS

| | | | |
|---|---|---|---|
| 3,273,146 | 9/1966 | Hurwitz, Jr. | 343/6.8 |
| 3,568,104 | 3/1971 | Bailey | 333/30 |
| 3,691,406 | 9/1972 | Mize | 310/313 R |
| 3,769,615 | 10/1973 | deKlerk | 310/313 R |
| 3,962,673 | 6/1976 | Desbois et al. | 310/313 R |
| 4,059,831 | 11/1977 | Epstein | 310/313 R |
| 4,096,477 | 6/1978 | Epstein et al. | 310/313 R |
| 4,101,852 | 7/1978 | Epstein et al. | 333/142 |
| 4,296,348 | 10/1981 | Toda | 310/334 |
| 4,468,639 | 8/1984 | Green et al. | 333/153 |
| 4,625,208 | 11/1982 | Skeie et al. | 342/51 |
| 4,636,678 | 1/1987 | Ballato | 310/313 R |
| 4,746,830 | 5/1988 | Holland | 310/313 D |
| 4,752,709 | 6/1988 | Fujishima et al. | 310/313 B |
| 4,801,941 | 1/1989 | Sabet-Peyman | 342/378 |

OTHER PUBLICATIONS

"Surface Skimming Bulk Waves, SSBW", by M. Lewis, 1977 Ultrasonies Symposium Proceedings.

*Primary Examiner*—Thomas M. Dougherty

[57] ABSTRACT

An electronic article surveillance system including a bulk acoustic wave transponder 10 coupled to an antenna 12, an interrogator 14, directional antenna 16 and an output connector 18. The transponder comprises a silicon or glass substrate 20, bus electrodes 22, 24, a launching IDT T0 and a series of "connected" and "unconnected" IDTs T1-T4. The connected/unconnected state of the respective IDTs T1-T4 may be detected and employed to generate an identification code comprising a series of binary digits. A thin copolymer piezoelectric film 26 covers the substrate 20 and electrodes T0-T4.

1 Claim, 3 Drawing Sheets

BULK WAVE TRANSPONDER

FIELD OF THE INVENTION

The present invention generally relates to electronic article surveillance (EAS) systems, and more particularly relates to an inexpensive passive (unpowered) transponder for use in such systems.

BACKGROUND OF THE INVENTION

Electronic article surveillance systems track the movement and location of articles, vehicles and the like, and are particularly useful in the detection of theft in retail stores, libraries, etc. These systems employ portal control using either radio frequency (RF) transceivers or magnetometer scanners at store exits to detect the presence (and unauthorized removal) of a passive RF transponder or magnetized tag. U.S. Pat. No. 4,746,830, which issued May 24, 1988 and which is hereby incorporated by reference into this specification, discloses a coded Surface Acoustic Wave (SAW) transponder for use in such a system. In that system, pulse-modulated RF signals are transmitted by a transceiver, or interrogator, and received by the transponder via its antenna. The signals in the transponder are impressed across bus electrodes and converted by way of piezoelectric action into a SAW at a launching IDT. The SAW propagates on the surface of a crystal substrate composed of LiNbO$_3$, and then is received by a number of interdigital transducers (IDTs) at different points (and at different times) along the surface of the substrate. The IDTs typically are spaced a constant distance apart along the bus electrodes. The SAW is then converted to a voltage signal at each IDT and radiated back, via the bus electrodes and antenna, as a reply to the interrogator. Further, at prescribed locations along the substrate there are connected or unconnected IDTs, thus producing binary (0 or 1) reply code bits. This SAW transponder is also referred to as a "smart tag", and is used in a way similar to the way bar codes are used in supermarkets.

The conventional smart tag uses a substrate composed of LiNbO$_3$ crystal, which is very expensive. Accordingly, one object of the present invention is to replace the LiNbO$_3$ substrate by a substrate composed of an inexpensive low loss material, such as silicon or glass. A piezoelectric copolymer film overlaid on the surface of silicon or glass (each of which is non-piezoelectric) can generate a surface acoustic wave, but any such wave will be extremely attenuated (100–1000 dB) because of high mechanical loss in the polymer. However, the present inventor has proposed the use of bulk waves, which can be efficiently generated with IDTs. The above-referenced '830 patent discusses the use of bulk waves in a bulk acoustic wave (BAW) piezoelectric resonator for detecting field disturbance responses to roadside oscillators. See column 2, lines 48–62. However, the '830 patent dismisses such a device as having an unwieldy size, excessive expense, short range, slow processing speed and limited code capacity. Thus a further object of the present invention is to provide a relatively inexpensive bulk acoustic wave transponder that avoids these shortcomings. The present invention achieves these goals.

SUMMARY OF THE INVENTION

A bulk acoustic wave transponder in accordance with the present invention comprises an antenna and a bulk wave transducer coupled to the antenna. The bulk wave transducer comprises a substrate and a plurality of interdigital transducers so disposed upon the substrate as to generate, in response to an interrogation signal received by the antenna, a response signal conveying an identifying code. In accordance with the invention, a layer of piezoelectric film is in contact with IDTs so as to facilitate the generation of bulk waves.

In the preferred embodiments described below, the substrate is composed of non-piezoelectric silicon or glass. In addition, each IDT may comprise a plurality of periodically-spaced electrodes. In one embodiment the periodicity of the spacing of the electrodes is substantially uniform. In another embodiment the periodicity of the spacing of the electrodes is non-uniform, and the respective widths of the electrodes of the IDTs are such that respective bulk waves generated by the electrodes will be focussed within a prescribed region of the substrate.

The said plurality of IDTs may comprise a launching IDT coupled to the antenna and at least one other IDT disposed upon the substrate at a prescribed spacing (D) relative to the launching IDT. In this embodiment, a response signal generated by the transponder will have a frequency component (f) which has a known relation to the said prescribed spacing D.

In addition, the plurality of IDTs may comprise a series of connected and unconnected IDTs ($T_1$, $T_2$, $T_3$, ... $T_N$) so disposed as to generate a response signal in which is encoded a prescribed sequence of digits, wherein each digit (digit$_i$) corresponds to a unique IDT ($T_i$) and is capable of representing at least two conditions, including the connected/unconnected state of its corresponding IDT, and wherein each digit is carried via a unique frequency ($f_i$).

The present invention also encompasses interrogation systems comprising transmitter means for transmitting an interrogation signal, a bulk wave transponder in accordance with the foregoing description, and receiver means for receiving a response signal generated by the transponder and detecting the identifying code.

In addition, the present invention encompasses methods for generating an identification signal in response to an interrogation signal. Methods in accordance with the invention comprise the steps of generating in response to an interrogation signal a plurality of bulk wave signals, and receiving and retransmitting each of the said bulk wave signals by a different one of a series of transducers, each transducer converting its corresponding bulk wave signal into an electromagnetic signal indicative of a prescribed condition of that transducer, a sum of the electromagnetic signals being indicative of the identity of the transponder.

It should be noted that acoustic wave attenuation of the type that occurs through the piezoelectric polymer had been considered a disadvantage for SAW applications. However, with the present invention it can be an advantage, since it absorbs any surface acoustic waves, which are considered noise in the context of a bulk acoustic wave transponder. In addition, in the embodiments wherein the width of the respective IDT electrodes and the space between adjacent electrodes are adjusted to focus the BAWs within a small target area of the substrate, the overall size of the transponder may be reduced and/or the number of IDTs and the number of bits in the identification signal may be increased.

Still another advantage of the present invention is that it significantly improves the yield achievable in mass producing the device. In the case of prior art SAW devices, the electrode width and spacing for the IDTs, for an excitation signal of 915 MHz, are on the order of 1 μm. This approaches the limit of photolithography production methods, so the use of such methods is a problem in that the yield will be low. However, the electrode width and spacing for the IDTs of a BAW device in accordance with the present invention, with a silicon or glass substrate, are approximately 3–5 μm, which offers significantly better production yields. Other features and advantages of the present invention are described below.

DETAILED DESCRIPTION OF PREFERRED EMBODIMENTS

Figure 1:
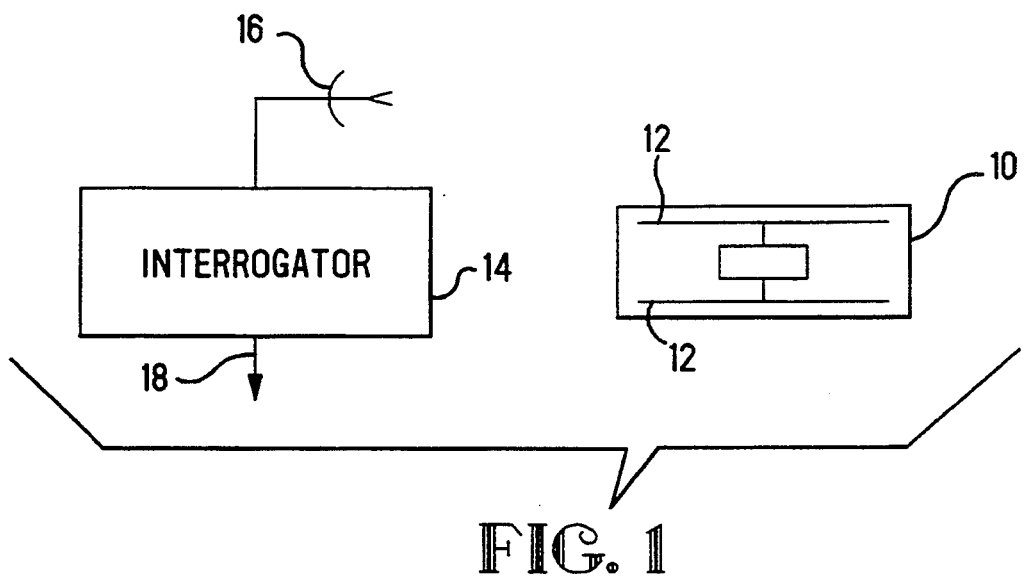
FIG. 1 is a block diagram of an electronic article surveillance and identification system.

The EAS system of FIG. 1 includes a bulk wave transponder 10 (which is described in detail below) coupled to or including an antenna 12 (e.g., a half-wavelength dipole), an interrogator 14, directional antenna 16, and an output connector 18. The interrogator, or transceiver, may be of the type described in the above-referenced '830 patent. The output connector may be used to transfer data from the interrogator 14 to a device, such as a computer, for further processing.

Figure 2A:
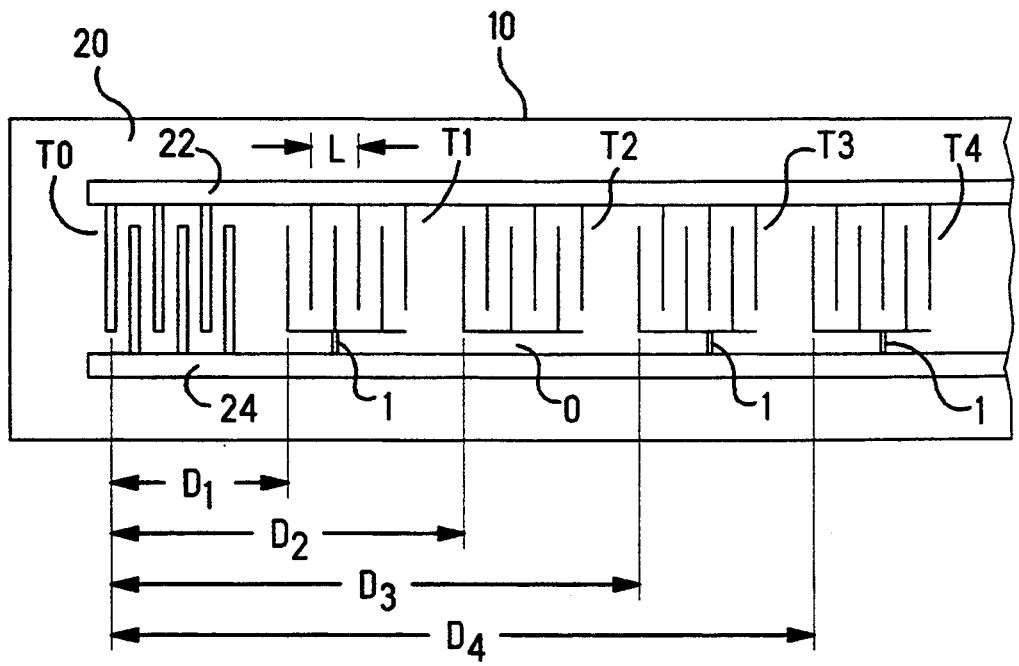
FIG. 2A depicts a top plan view of a bulk wave transponder in accordance with the present invention.
Figure 2B:
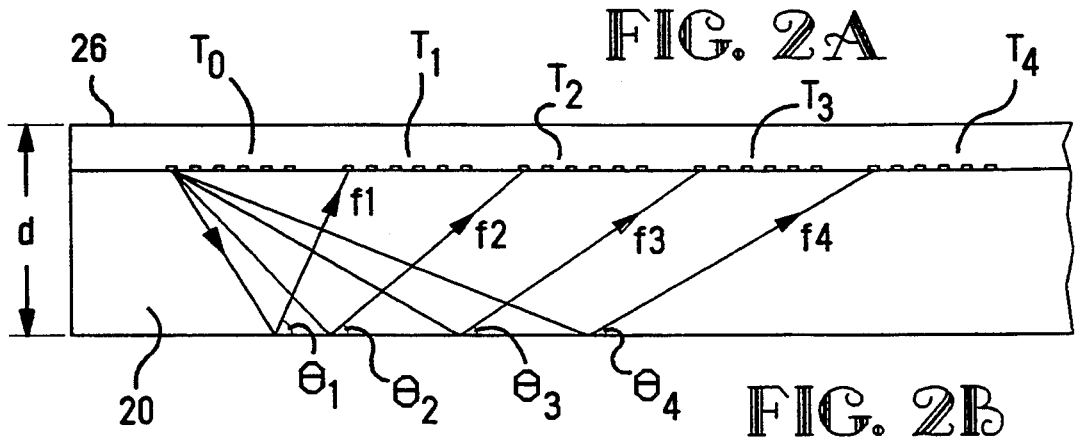
FIG. 2B depicts a side plan view of the bulk wave transponder depicted in FIG. 2A.

FIGS. 2A and 2B depict top and side plan views, respectively, of the bulk wave transponder 10. The transponder comprises a silicon or glass substrate 20, bus electrodes 22, 24, a launching IDT T0 and a series of "connected" and "unconnected" IDTs T1–T4 (only center lines for IDTs T1–T4 are shown in FIG. 2A). The primary difference between the launching IDT T0 and the other IDTs T1–T4 is that the launching IDT has a greater number of electrodes and thus generates stronger BAWs. In the exemplary transponder 10 of FIG. 2A, the connected/unconnected state of the respective IDTs T1–T4 may be detected and employed to generate an identification code comprising a series of binary digits, or bits. The identification code of the embodiment of FIG. 2A is "1011". A thin copolymer piezoelectric film 26 (FIG. 2B) covers the substrate 20 and electrodes T0–T4; an alternative structure (not shown) has the IDTs on top of the piezoelectric layer. One preferred embodiment of the transponder 10 comprises a silicon substrate of a thickness d 32 0.50 mm.

(silicon is preferable to glass for high frequency operation because of its lower propagation loss.)

Figure 3:
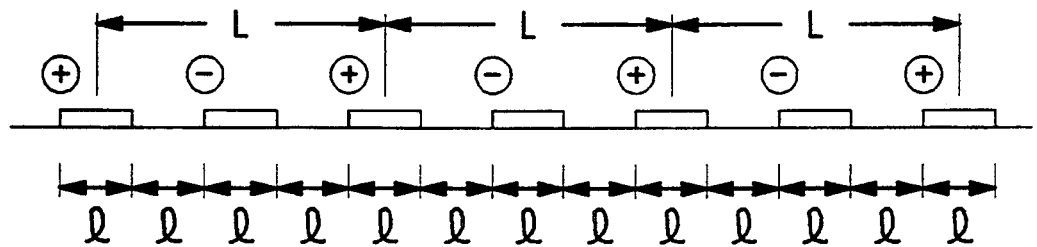
FIG. 3 schematically depicts a side view of one interdigital transducer of a bulk wave transponder in accordance with the present invention.

When electromagnetic energy excites the antenna 12 (FIG. 1) of the transducer 10, a bulk wave (or BAW) is launched by the launching IDT T0 at an inclined angle $\theta$ into the substrate 20. The inclined bulk wave is excited at a higher frequency than a SAW. The angle, or trajectory, of the bulk wave is a function of the operating frequency and of the spacing of the IDTs (the higher the frequency the larger the angle). The wavelength $\lambda$ of a bulk wave is related to the angle $\theta$ by $$\lambda = L\cos\theta \qquad (1)$$

where L represents the spacing between two electrodes (or "fingers") having a common potential, as shown in FIG. 3. In addition, $\lambda$ is related to the frequency f by $$\lambda = v_a/f \qquad (2)$$

where $v_a$ represents the acoustic velocity of the bulk wave in the substrate. Therefore, the angle $\theta$ is given by $$\theta = \arccos(v_a/Lf) \qquad (3)$$

Further, multiple bulk waves of different frequencies and different angles may be generated by applying multiple electromagnetic signals of different frequencies to IDT T0. FIG. 2B schematically depicts bulk waves of frequencies $f_1$–$f_4$ and angles $\theta_1$–$\theta_4$, respectively, launched from IDT T0, reflected from the bottom substrate-air interface and then received by the respective IDTs T1–T4. It is apparent that the inter-IDT spacings $D_i$ are related to the frequencies $f_i$ and substrate thickness d as follows:

$$\begin{aligned} D_i &= 2d/\tan\theta_i \\ &= 2d/\tan(\arccos(v_a/Lf_i)) \end{aligned} \qquad (4)$$

The electromagnetic interrogation signal received by the launching IDT T0 may preferably be pulse modulated as a tone burst and the bulk wave received by each IDT T1–T4 (at different times) may then be piezoelectrically converted to an electromagnetic wave of the same frequency as a corresponding component of the interrogation signal, but only if that IDT is connected to the common bus 24 (FIG. 2A). Therefore a binary code will be generated in accordance with the connected/unconnected state of the IDTs T1–T4. The electromagnetic signals are then transmitted via the bus electrodes 22, 24 and antenna 12, and can be received by the interrogator 14.

Referring to FIG. 2A, the spacing of IDTs T1–T4 from the launching IDT T0 may be fixed in accordance with the following table, which shows the frequency, angle and wavelength for six exemplary bulk waves and the position $D_i$ of the IDT that will receive that bulk wave (note that only four bulk waves are depicted in FIG. 2B):

$f_1 = 980$ MHz., $\theta_1 = 25.6°$, $\lambda_1 = 8.61$ μm, $D_1 = 2.31$ mm
$f_2 = 945$ MHz., $\theta_2 = 20.7°$, $\lambda_2 = 8.92$ μm, $D_2 = 2.82$ mm
$f_3 = 930$ MHz., $\theta_3 = 18.1°$, $\lambda_3 = 9.07$ μm, $D_3 = 3.21$ mm
$f_4 = 915$ MHz., $\theta_4 = 15.0°$, $\lambda_4 = 9.22$ μm, $D_4 = 3.86$ mm
$f_5 = 900$ MHz., $\theta_5 = 10.8°$, $\lambda_5 = 9.37$ μm, $D_5 = 5.34$ mm
$f_6 = 890$ MHz., $\theta_6 = 6.8°$, $\lambda_6 = 9.47$ μm, $D_6 = 8.45$ mm For this example, L=9.54 μm and l=2.39 μm for all IDTs (see FIG. 3).

Figure 4:
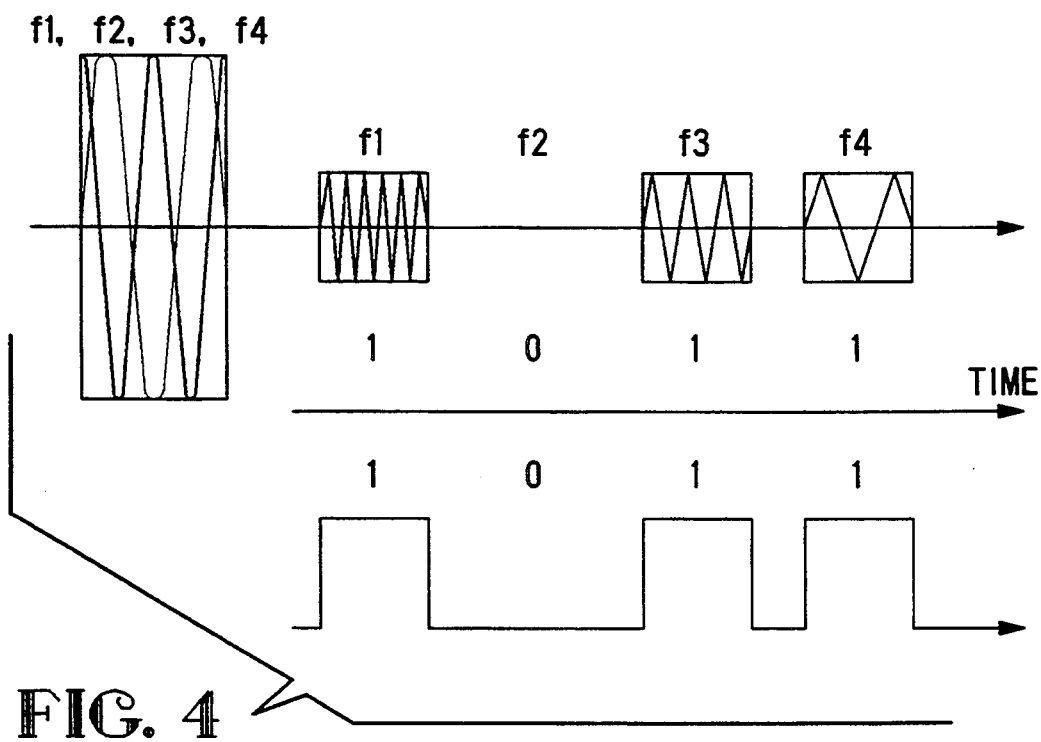
FIG. 4 schematically depicts an exemplary series of signals produced by a bulk wave transponder in accordance with the present invention, and is also indicative of one mode of processing said signals to produce an identification signal.
Figure 5:
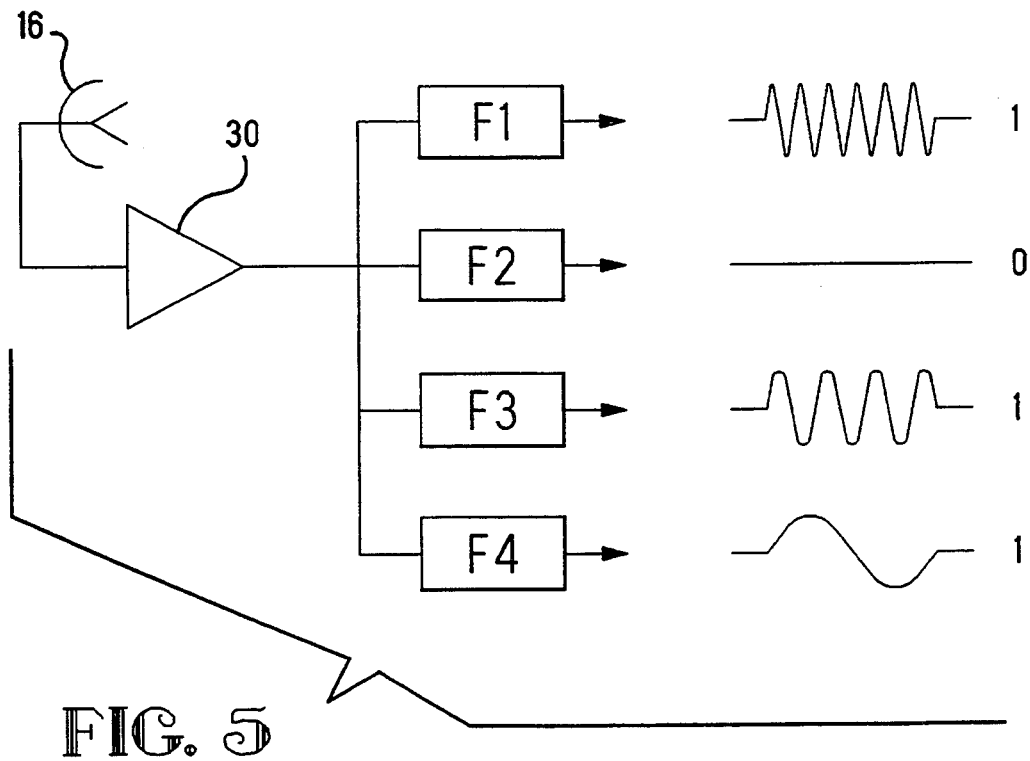
FIG. 5 schematically depicts an alternative mode of processing identification signals produced by a bulk wave transponder in accordance with the present invention.

FIG. 4 depicts an exemplary series of signals produced by a bulk wave transponder in accordance with the present invention. One method for detecting an identification code within the modulated signals uses the known time delays of the respective signals of different frequencies. Those of ordinary skill in the art will recognize that the output signal will be either 0 or 1 within predetermined time intervals, depending on whether or not the corresponding IDT for that interval is connected to the common bus 24 (FIG. 2A). Another method for detecting an identification signal employs bandpass filtering, as shown in FIG. 5. Either one of these methods may be used, or they may be combined.

Figure 6:
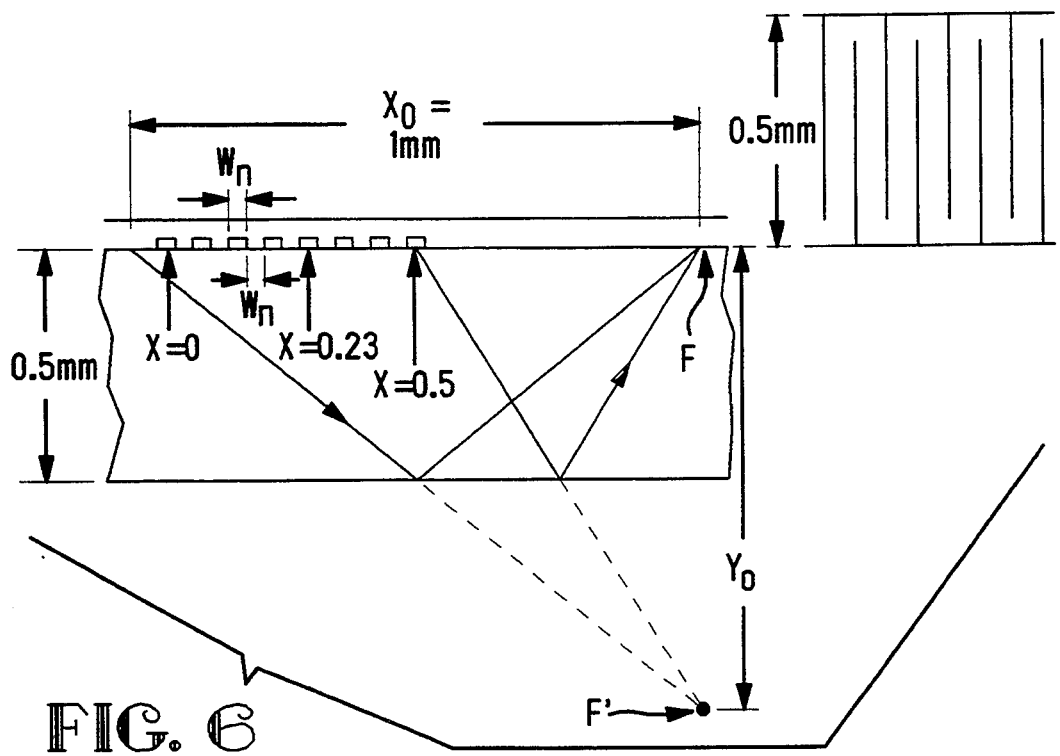
FIG. 6 schematically depicts an alternative, reduced-in-size embodiment of a bulk wave transponder in accordance with the present invention.

The width of the respective IDT electrodes and the space between adjacent electrodes can be adjusted to focus the BAWs into a small target area, or focal region F, of the substrate. This allows a reduction in the overall size of the transponder and/or an increase in the number of IDTs and the number of bits in the identification signal. (It should be noted however that the smaller embodiment introduces smaller time delays between the bits of the identification signal.) One example of a transducer embodying such a scheme is schematically depicted in FIG. 6, which shows a bulk wave being focussed into the focal region F. There are relationships among the bulk wave frequencies, transducer size, delay times and the desired number of bits. The key to a successful transponder design is to optimize these parameters.

Referring to FIG. 6, the electrode width $W_n$ at $X = X_n$ is given by $$W_n = (\lambda/4) \frac{\sqrt{(X_0 - X)^2 + Y_0^2}}{X_0 - X}$$

where $X_0$ and $Y_0$ represent the coordinates of the image $F'$ of the focal region F. For a silicon substrate and an operating frequency of 915 MHz, exemplary values for the width and spacing $W_n$ of the respective electrodes of the embodiment of FIG. 6 are as follows (note that the width of a given electrode is equal to the spacing between that electrode and the next electrode in the series):

$W_n = 3.26$ μm at $X = 0.00$ mm $W_n = 3.84$ μm at $X = 0.25$ mm $W_n = 5.15$ μm at $X = 0.50$ mm.

For these values, the distance between $X = 0.0$ and the focal region F (the focal length) is approximately 1.0 mm; for a 10% higher operating frequency (1006.5 MHz) the focal region F would shift to the left approximately 0.108 mm, and for a 10% lower operating frequency (831 MHz) the focal region would shift to the right approximately 0.129 mm.

In both focussed and non-focussed embodiments of the invention, a given IDT may generate both a surface acoustic wave and a bulk acoustic wave. Since the SAW propagation velocity is 4900 m/s in silicon, SAW generation becomes maximum at 514 MHz ($f\lambda = v_a = 4900$ m/s, $\lambda = L = 9.54$ μm) for the structure of the above example. (SAWs may also be generated at other frequencies, but those will be weaker than the primary wave.) However, high frequency operation is important because the antenna becomes smaller as the operating frequency increases. For example, a half-wavelength antenna has a length of 5 cm (approximately 2 inches) at a frequency of 1000 MHz and a length of 50 cm (approximately 20 inches) at 100 MHz. Moreover, propagation loss rapidly increases with increasing frequency, but is relatively small in single crystal substrates. Silicon is the least expensive crystal material, thus it is a preferred material for the substrate. Glass is less expensive than silicon, but is more lossy. Neither glass, fuzed quartz, nor silicon are piezoelectric, so piezoelectric film must be placed on the surface.

The foregoing description of preferred embodiments is not intended to limit the scope of protection of the present invention as described in the following claims. For example, the true scope of the invention is not limited to the use of a silicon or glass substrate, since other materials capable of efficiently propagating bulk waves (e.g., germanium, quartz, sapphire) may be used. Other modifications will be apparent to those of ordinary skill in the art.

What is claimed is:

1. A transponder, comprising:
   (a) an antenna; and
   (b) a bulk wave transducer, coupled to said antenna, comprising a substrate, first and second bus electrodes, a plurality of interdigital transducers (IDTs) so disposed upon said substrate as to generate, in response to an interrogation signal received by said antenna, a response signal conveying an identifying code, and a layer of piezoelectric film in contact with said IDTs; wherein each of said IDTs is coupled to at least one of said first and second bus electrodes; wherein said plurality of IDTs comprises a series of connected and unconnected IDTs ($T_1$, $T_2$, $T_3$ ... $T_N$) so disposed as to generate a response signal in which is encoded a prescribed sequence of digits, wherein the connected IDTs are connected to both said first and second bus electrodes and the unconnected IDTs are unconnected to said second bus electrode; wherein all of said IDTs are disposed on a single surface of said substrate; wherein each digit ($digit_i$) corresponds to a unique IDT ($T_i$) and is capable of representing at least two conditions, including the connected/unconnected state of its corresponding IDT; wherein each digit is carried via a unique frequency ($f_i$); and wherein the inter-IDT spacings $D_i$ are related to the frequencies $f_i$ as follows:

$D_i = 2d/\tan(\arccos(v_a/Lf_i))$, where $v_a$ represents the velocity of the bulk waves in the substrate, d represents the thickness of the substrate, and L represents two times the spacing between adjacent electrodes of the IDTs plus the width of an electrode.

* * * * *